(12) United States Patent
Motwani et al.

(10) Patent No.: US 9,652,321 B2
(45) Date of Patent: May 16, 2017

(54) RECOVERY ALGORITHM IN NON-VOLATILE MEMORY

(71) Applicant: Intel Corporation, Santa Clara, CA (US)

(72) Inventors: Ravi H. Motwani, San Diego, CA (US); Kiran Pangal, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 94 days.

(21) Appl. No.: 14/493,956

(22) Filed: Sep. 23, 2014

(65) Prior Publication Data

US 2016/0085621 A1    Mar. 24, 2016

(51) Int. Cl.
| | | |
|---|---|---|
| *G06F 11/10* | (2006.01) | |
| *G11C 29/52* | (2006.01) | |
| *G06F 12/02* | (2006.01) | |
| *H03M 13/11* | (2006.01) | |
| *G11C 29/04* | (2006.01) | |

(52) U.S. Cl.
CPC .......... *G06F 11/1008* (2013.01); *G06F 11/10* (2013.01); *G06F 11/108* (2013.01); *G06F 11/1068* (2013.01); *G06F 12/0246* (2013.01); *G11C 29/52* (2013.01); *H03M 13/1108* (2013.01); *G11C 2029/0411* (2013.01)

(58) Field of Classification Search
CPC ............... G06F 11/1008; G06F 11/108; G06F 11/1068; G06F 12/0246; G06F 11/10; G11C 29/52; G11C 2029/0411; H03M 13/1108

USPC ....... 714/764, 758, 763, 768, 773, 746, 718, 714/799, 6.2, 42, 48, 54; 711/103–105; 365/200, 201, 185.09
See application file for complete search history.

(56) References Cited

U.S. PATENT DOCUMENTS

| | | | |
|---|---|---|---|
| 8,959,407 B2* | 2/2015 | Motwani | H03M 13/3723 714/704 |
| 9,021,339 B2* | 4/2015 | Lu | G06F 11/108 711/114 |
| 2006/0039196 A1* | 2/2006 | Gorobets | G06F 11/106 365/185.01 |

(Continued)

FOREIGN PATENT DOCUMENTS

TW    201421483 A    6/2014

OTHER PUBLICATIONS

International Search Report and Written Opinion received for PCT Application No. PCT/US2015/046024, mailed on Dec. 29, 2015.

*Primary Examiner* — John J Tabone, Jr.
(74) *Attorney, Agent, or Firm* — Thorpe North & Western, LLP; Todd B. Alder (57) ABSTRACT

Apparatus, systems, and methods for Recovery algorithm in memory are described. In one embodiment, a controller comprises logic to receive a read request from a host device to read a line of data to the memory device, wherein the data is spread across a plurality (N) of dies and comprises an error correction code (ECC) spread across the plurality (N) of dies, retrieve the line of data from the memory device, perform an error correction code (ECC) check on the line of data retrieved from the memory device, and invoke a recovery algorithm in response to an error in the ECC check on the line of data retrieved from the memory device. Other embodiments are also disclosed and claimed.

21 Claims, 9 Drawing Sheets

(56) References Cited

U.S. PATENT DOCUMENTS

| | | | | |
|---|---|---|---|---|
| 2006/0085671 A1* | 4/2006 | Majni | G06F 11/108 | 714/5.1 |
| 2007/0174682 A1* | 7/2007 | King | G06F 11/1435 | 714/6.13 |
| 2010/0023800 A1* | 1/2010 | Harari | G06F 11/1068 | 714/2 |
| 2011/0040924 A1* | 2/2011 | Selinger | G06F 11/10 | 711/103 |
| 2011/0041005 A1* | 2/2011 | Selinger | G06F 11/10 | 714/719 |
| 2011/0041039 A1* | 2/2011 | Harari | G06F 11/1068 | 714/773 |
| 2011/0161554 A1* | 6/2011 | Selinger | G06F 13/00 | 711/103 |
| 2011/0161784 A1* | 6/2011 | Selinger | G06F 11/1068 | 714/768 |
| 2011/0307762 A1* | 12/2011 | Tiziani | G06F 11/10 | 714/768 |
| 2012/0260146 A1* | 10/2012 | Lee | G06F 11/1068 | 714/763 |
| 2012/0311381 A1* | 12/2012 | Porterfield | G06F 11/1004 | 714/6.22 |
| 2012/0311388 A1* | 12/2012 | Cronin | G06F 11/1004 | 714/42 |
| 2013/0304970 A1* | 11/2013 | Parizi | G06F 3/0611 | 711/103 |
| 2013/0318419 A1* | 11/2013 | Seol | G06F 11/1412 | 714/773 |
| 2014/0149825 A1* | 5/2014 | Motwani | H03M 13/3723 | 714/764 |
| 2014/0149826 A1* | 5/2014 | Lu | G06F 11/108 | 714/764 |
| 2015/0019933 A1* | 1/2015 | Yamazaki | G06F 11/1008 | 714/758 |
| 2015/0149857 A1* | 5/2015 | Motwani | H03M 13/05 | 714/763 |

* cited by examiner

RECOVERY ALGORITHM IN NON-VOLATILE MEMORY

TECHNICAL FIELD

The present disclosure generally relates to the field of electronics. More particularly, some embodiments of the invention generally relate to a recovery algorithm in memory for electronic devices.

BACKGROUND

Many electronic devices include memory systems that may be implemented using local, fast-access memory which is frequently embodied as a nonvolatile memory, e.g., flash memory or the like. In some examples error correction codes (ECC) may be used to protect the data from raw bit errors (RBER). In order to get RBER diversity advantage, the ECC codeword may be spread over multiple dies. Examples of ECC codewords may include BCH codes, Reed-Solomon codes, low-density parity check (LDPC), Convolutional Codes, Hamming Codes, or the like. To provide resilience to die failures, RAID mechanisms may be used to store the XOR of the contents of all dies.

Accordingly, techniques to improve RBER performance in encrypted memory may find utility, e.g., in memory systems for electronic devices.

BRIEF DESCRIPTION OF THE DRAWINGS

The detailed description is provided with reference to the accompanying figures. The use of the same reference numbers in different figures indicates similar or identical items.

DESCRIPTION OF EMBODIMENTS

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Figure 1:
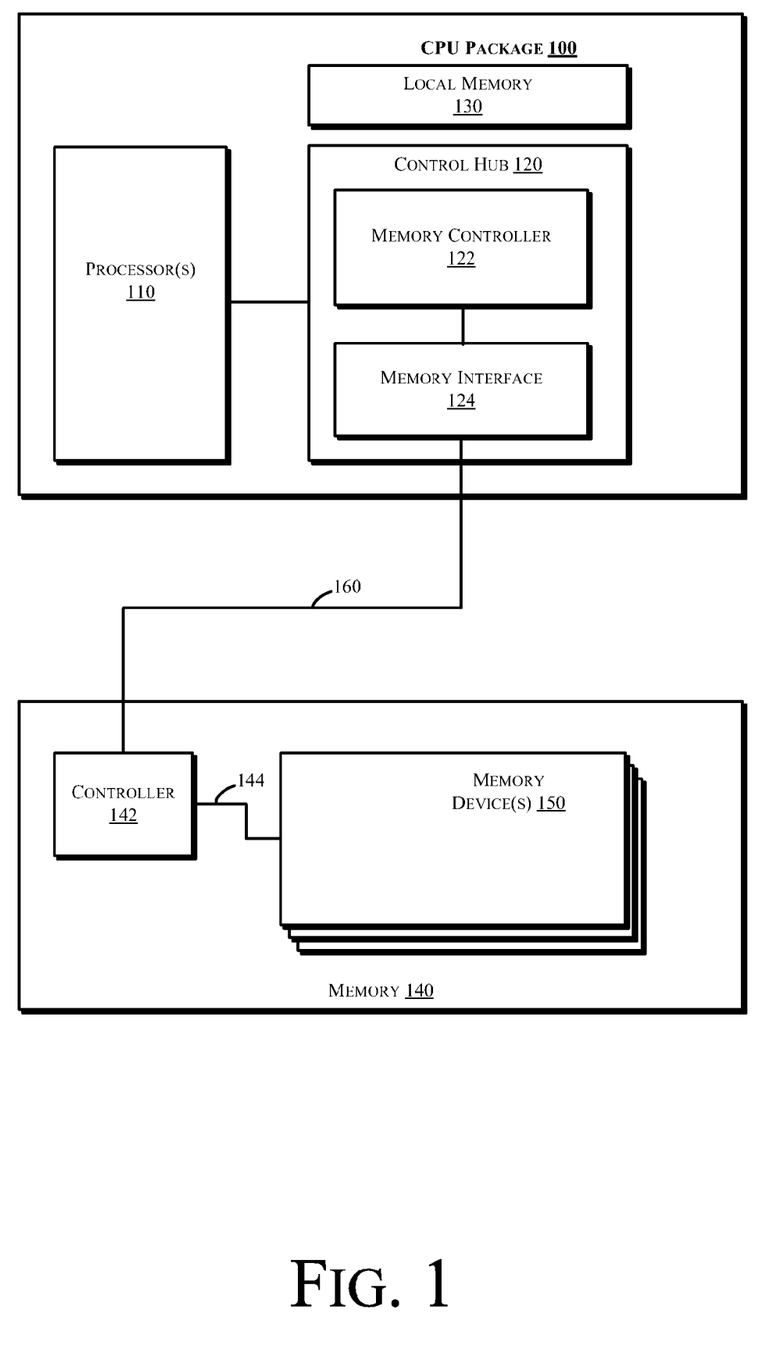
FIG. 1 is a schematic, block diagram illustration of components of apparatus to implement a recovery algorithm in non-volatile memory in accordance with various examples discussed herein.

FIG. 1 is a schematic, block diagram illustration of components of apparatus to implement a recovery algorithm in memory in accordance with various examples discussed herein. Referring to FIG. 1, in some embodiments a central processing unit (CPU) package 100 which may comprise one or more processors 110 coupled to a control hub 120 and a local memory 130. Control hub 120 comprises a memory controller 122 and a memory interface 124.

Memory interface 124 is coupled to a remote memory 140 by a communication bus 160. In some examples, the communication bus 160 may be implemented as traces on a printed circuit board, a cable with copper wires, a fibre optic cable, a connecting socket, or a combination of the above. Memory 140 may comprise a controller 142 and one or more memory device(s) 150. In various embodiments, at least some of the memory devices 150 may be implemented using volatile memory, e.g., static random access memory (SRAM), a dynamic random access memory (DRAM), or non-volatile memory, e.g., phase change memory, NAND (flash) memory, ferroelectric random-access memory (Fe-RAM), nanowire-based non-volatile memory, memory that incorporates memristor technology, three dimensional (3D) cross point memory such as phase change memory (PCM), spin-transfer torque memory (STT-RAM), magnetoresistive random access memory (MRAM), or NAND flash memory. The specific configuration of the memory device(s) 150 in the memory 140 is not critical.

In some examples in which data is stored across multiple dies in the memory devices 150 in memory 140, an ECC codeword may similarly be stored across multiple dies. In the example depicted in FIG. 2 data may be split across a number, N, dies in memory and a portion of the ECC codeword may be stored in each die. The N+1 die may be used to store an exclusive OR (XOR) of the contents of the N dies.

Figure 2:
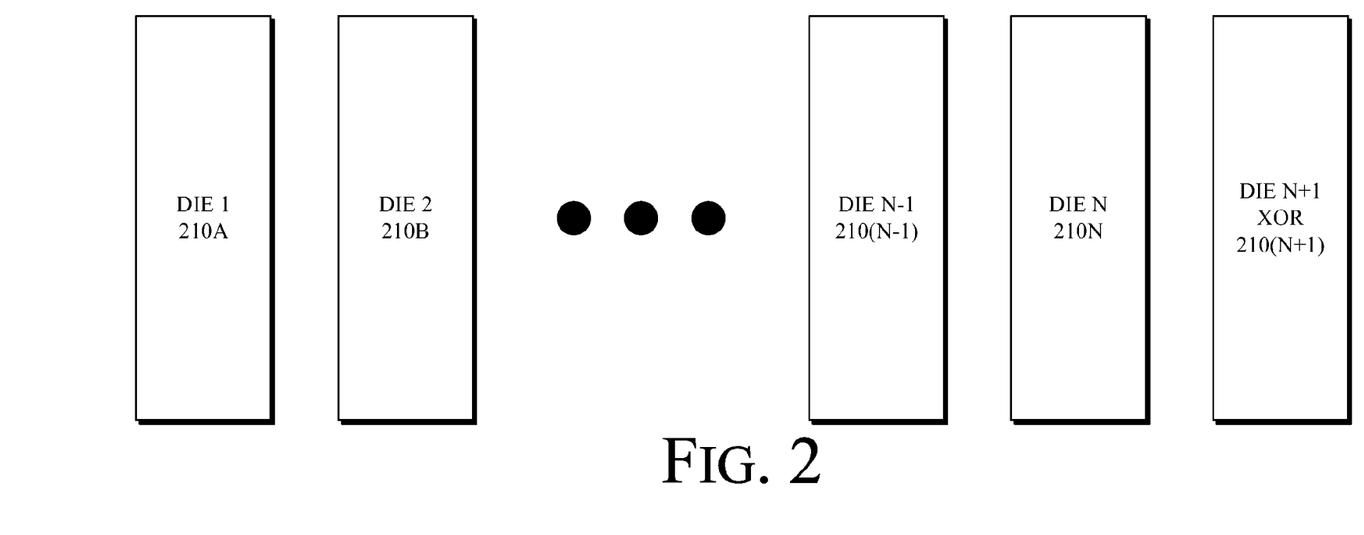
FIGS. 2-3 are is a schematic, block diagram illustration of a memory architecture to implement a recovery algorithm in write operations in non-volatile memory in accordance with various examples discussed herein.

The particular number N of dies in the memory is not critical. Depending upon the memory configuration the number N may vary between 2 and 30. In one example a memory may be configured with a number N equal to 18 dies to hold data and a 288 byte BCH codeword may be spread across the 18 dies with a burst of 16 bytes (B) stored per die. A 19th die stores the XOR of the contents of the 18 dies. The 16B burst stored in the XOR die which is obtained by obtaining an XOR of the 288 bytes of a single BCH codeword.

Figure 4:
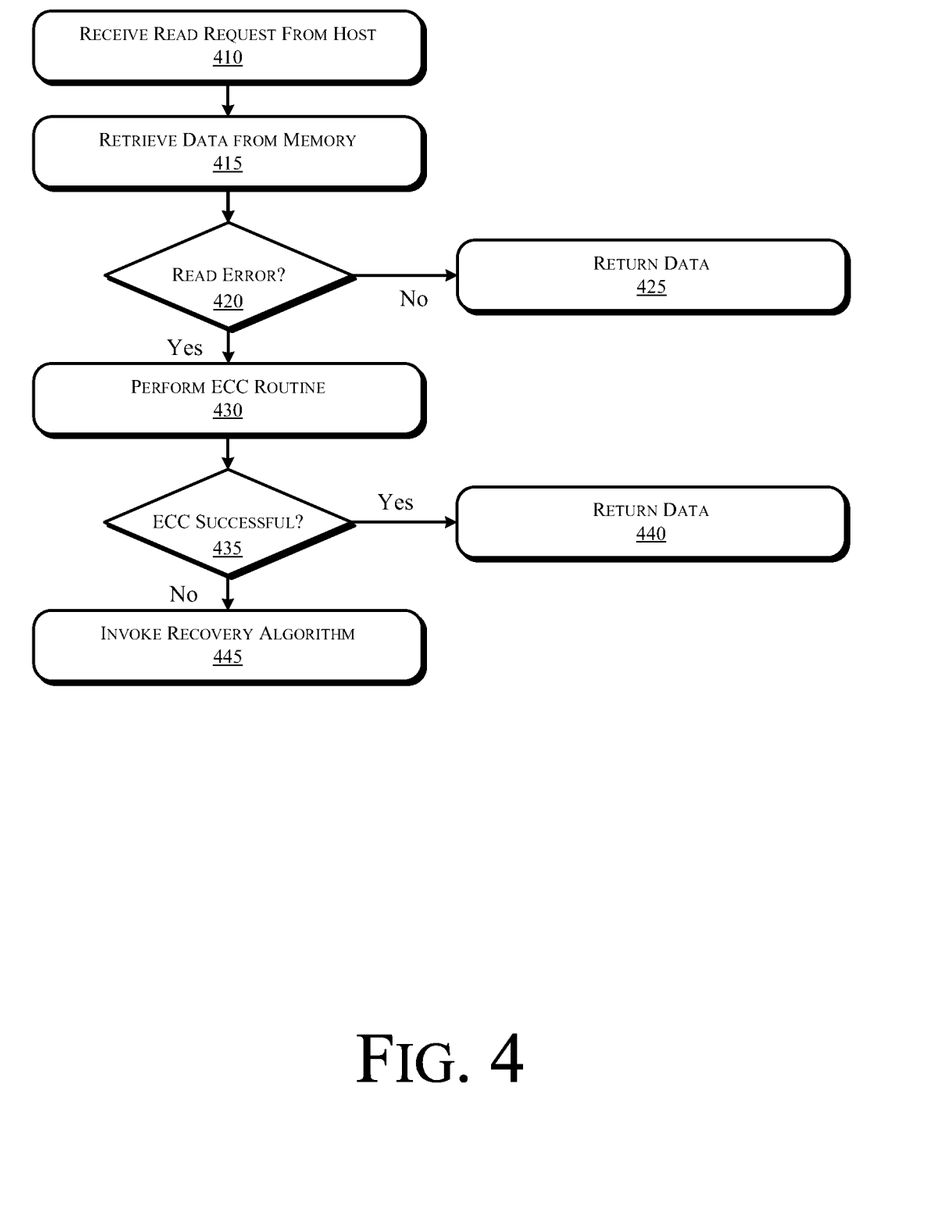
FIGS. 4-5 are flowcharts illustrating operations in a method to implement a recovery algorithm in read operations in non-volatile memory accordance with various embodiments discussed herein.

FIG. 4 depicts operations in a first aspect of a method to implement a recovery algorithm in memory. In some examples the operations depicted in FIG. 4 may be implemented by logic in the controller 142, alone or in combination with logic in the memory controller 122 in the CPU package 100. Referring now to FIG. 4, at operation 410 the controller 142 receives a read request form a host device, e.g., from memory controller 122. The read request may include a logical address for a block of data stored in memory device(s) 150. Controller 142 may translate the logical address received with the read request to a physical address in memory device(s) 150 and, at operation 415, may retrieve the data from memory.

If, at operation 420, there is no read error for the retrieve data then control passes to operation 425 and the controller 142 returns the data retrieved from memory. By contrast, if at operation 420 there is a read error then control passes to operation 430 and the controller 142 implements an ECC routine to try to correct the read error.

If, at operation 435, the ECC routine is successful in correcting the read error then control passes to operation 440 and the controller 142 returns the data retrieved from memory. By contrast, if at operation 435 the ECC routine was unsuccessful in correcting the read error then control passes to operation 445 and the controller 142 implements a recovery algorithm.

Figure 3:
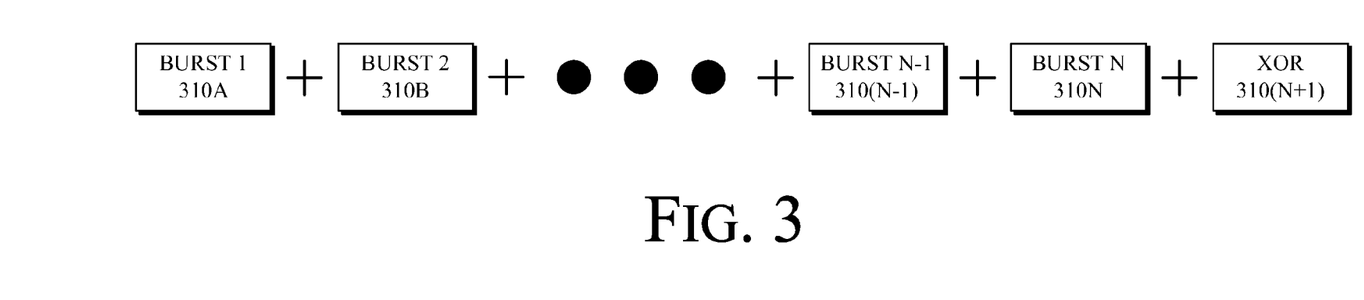
Figure 5:
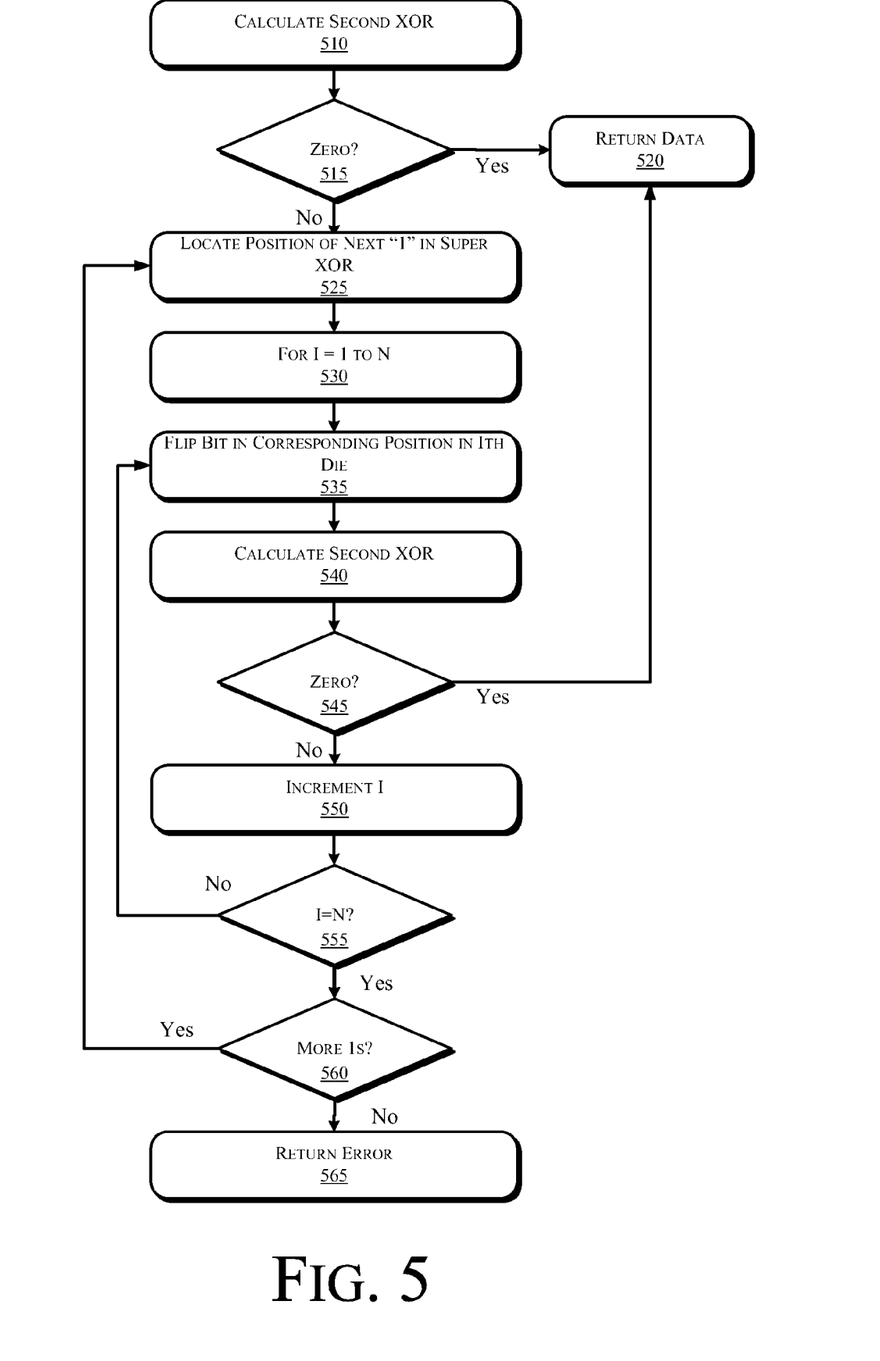

One example of a recovery algorithm will be described with reference to FIGS. 3 and 5. Referring to FIG. 5, at operation 510 a second XOR is calculated. In one example, the phrase "second XOR" shall refer to calculating the XOR of the 16 byte bursts from the N dies in the memory device(s) 150 and the XOR die. Referring to FIGS. 2-3, in a memory device 150 comprising N dies for data and an additional die (N+1) which contains the XOR of the data, a second XOR is determined by taking the XOR of the data bursts read from the respective dies indicted as 310A, 310B through 310(N) and the burst from the XOR die indicated as 310(N+1) in FIG. 3.

If, at operation 515, the second XOR is zero, indicating that there is no read error, then control passes to operation 520 and the data read from memory device(s) 150 is returned to the host device which initiated the request. By contrast, if at operation 515 the second XOR includes any ones, indicating that there are errors in the data, then control passes to operation 525.

If the errors in each die are at distinct positions, the second XOR will contain ones in corresponding locations. Thus, to attempt to correct the errors the recovery algorithm implements a process which sequentially flips bits in corresponding positions in the data bursts corresponding to the positions of the ones in the second XOR then recalculates the second XOR. The process may begin at either end of the second XOR and the position of the next one in the second XOR is located. Control then passes to operation 530 and a loop initiates which traverses the burst data and flips the bits at the corresponding position in the burst data (operation 535). At operation 540 the second XOR is recalculated.

If, at operation 545, the second XOR is zero, indicating that there is no read error, then control passes to operation 520 and the data read from memory device(s) 150 is returned to the host device which initiated the request. By contrast, if at operation 545 the second XOR includes any ones, indicating that there are errors in the data, then control passes to operation 550 and the value of the counter (i) is incremented.

If, at operation 555 the value of the counter (i) has not reached the number (N) of dies then control passes back to operation 535. By contrast, if, at operation 555 the value of the counter (i) has reached the number (N) of dies, indicating that the loop has cycled through all the dies in the memory device, then control passes to operation 560.

If, at operation 560 there are more ones in the second XOR then control passes back to operation 525 and the position of the next one in the second XOR is located. Thus, operations 525 through 560 define a loop pursuant to which each of the ones in the second XOR are located and the nested loop defined by operations 535 through 555 define a loop pursuant to which bits in the data bursts at positions corresponding to the one in the second XOR and the second XOR is recalculated. By contrast, if at operation 560 there are no more ones in the second XOR then control passes to operation 565 and an error is returned.

Figure 6:
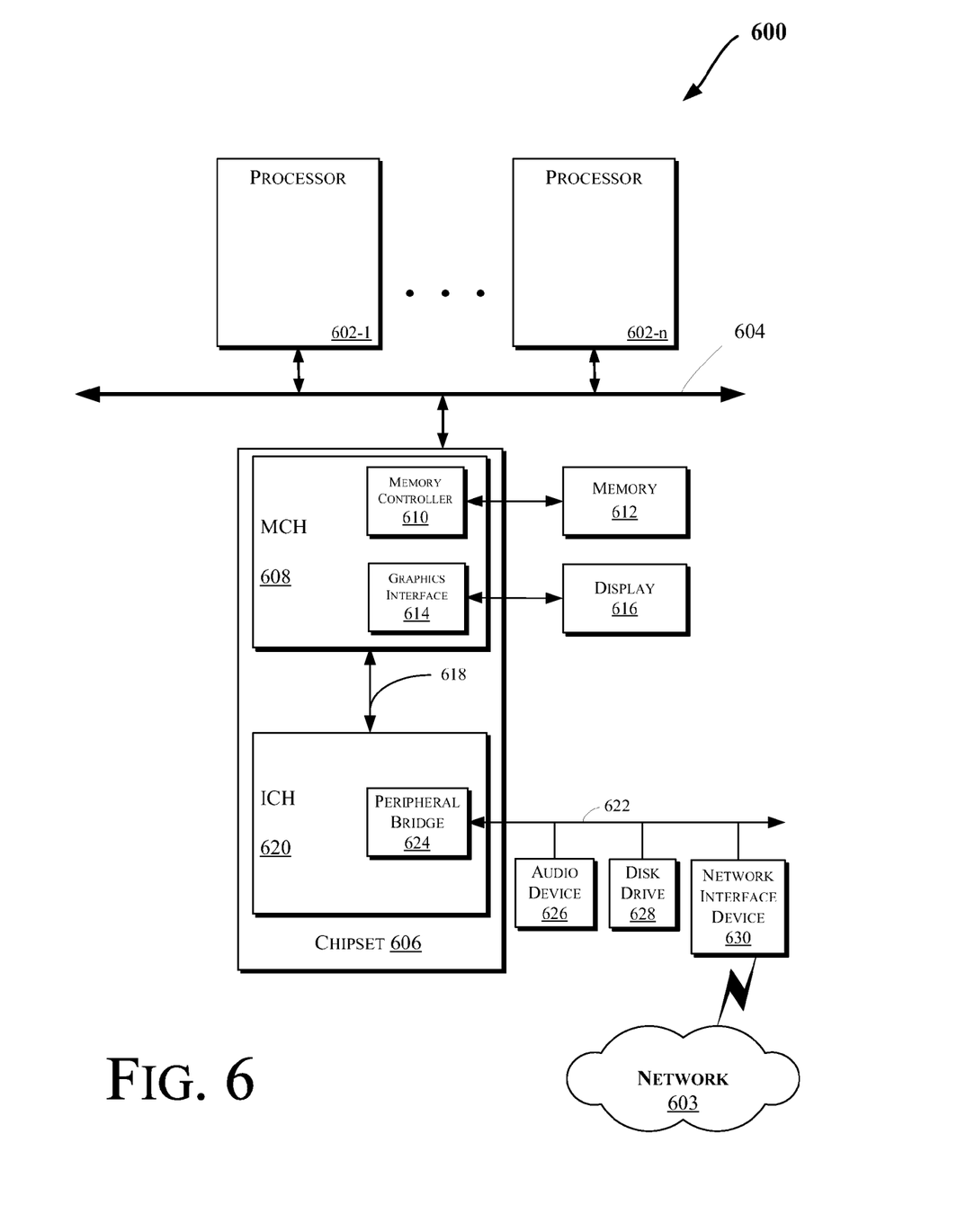
FIGS. 6-10 are schematic, block diagram illustrations of electronic devices which may be adapted to implement memory recovery management in accordance with various embodiments discussed herein.

As described above, in some embodiments the electronic device may be embodied as a computer system. FIG. 6 illustrates a block diagram of a computing system 600 in accordance with an embodiment of the invention. The computing system 600 may include one or more central processing unit(s) (CPUs) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors. In an embodiment, one or more of the processors 602 may be the same or similar to the processor0s 102 of FIG. 1. For example, one or more of the processors 602 may include the control unit 120 discussed with reference to FIGS. 1-3. Also, the operations discussed with reference to FIGS. 3-5 may be performed by one or more components of the system 600.

A chipset 606 may also communicate with the interconnection network 604. The chipset 606 may include a memory control hub (MCH) 608. The MCH 608 may include a memory controller 610 that communicates with a memory 612 (which may be the same or similar to the memory 130 of FIG. 1). The memory 412 may store data, including sequences of instructions, that may be executed by the CPU 602, or any other device included in the computing system 600. In one embodiment of the invention, the memory 612 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk or a solid state drive (SSD). Additional devices may communicate via the interconnection network 604, such as multiple CPUs and/or multiple system memories.

The MCH 608 may also include a graphics interface 614 that communicates with a display device 616. In one embodiment of the invention, the graphics interface 614 may communicate with the display device 616 via an accelerated graphics port (AGP). In an embodiment of the invention, the display 616 (such as a flat panel display) may communicate with the graphics interface 614 through, for example, a signal converter that translates a digital representation of an image stored in a storage device such as video memory or system memory into display signals that are interpreted and displayed by the display 616. The display signals produced by the display device may pass through various control devices before being interpreted by and subsequently displayed on the display 616.

A hub interface 618 may allow the MCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the CPU 602 and peripheral devices. Other types of topologies may be utilized. Also, multiple buses may communicate with the ICH 620, e.g., through multiple bridges or controllers. Moreover, other peripherals in communication with the ICH 620 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some embodiments of the invention. In addition, the processor 602 and one or more other components discussed herein may be combined to form a single chip (e.g., to provide a System on Chip (SOC)). Furthermore, the graphics accelerator 616 may be included within the MCH 608 in other embodiments of the invention.

Furthermore, the computing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
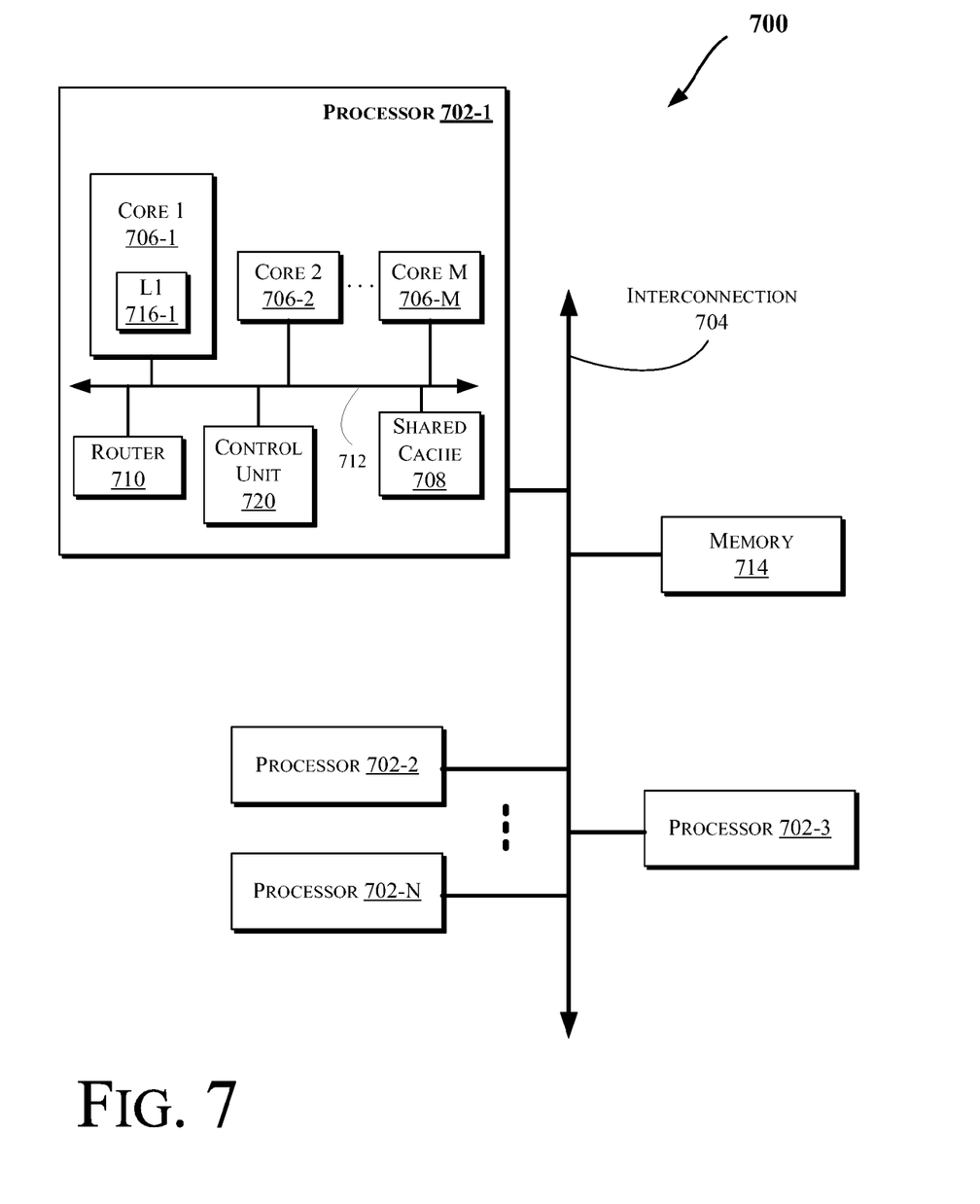

FIG. 7 illustrates a block diagram of a computing system 700, according to an embodiment of the invention. The system 700 may include one or more processors 702-1 through 702-N (generally referred to herein as "processors 702" or "processor 702"). The processors 702 may communicate via an interconnection network or bus 704. Each processor may include various components some of which are only discussed with reference to processor 702-1 for clarity. Accordingly, each of the remaining processors 702-2 through 702-N may include the same or similar components discussed with reference to the processor 702-1.

In an embodiment, the processor 702-1 may include one or more processor cores 706-1 through 706-M (referred to herein as "cores 706" or more generally as "core 706"), a shared cache 708, a router 710, and/or a processor control logic or unit 720. The processor cores 706 may be implemented on a single integrated circuit (IC) chip. Moreover, the chip may include one or more shared and/or private caches (such as cache 708), buses or interconnections (such as a bus or interconnection network 712), memory controllers, or other components.

In one embodiment, the router 710 may be used to communicate between various components of the processor 702-1 and/or system 700. Moreover, the processor 702-1 may include more than one router 710. Furthermore, the multitude of routers 710 may be in communication to enable data routing between various components inside or outside of the processor 702-1.

The shared cache 708 may store data (e.g., including instructions) that are utilized by one or more components of the processor 702-1, such as the cores 706. For example, the shared cache 708 may locally cache data stored in a memory 714 for faster access by components of the processor 702. In an embodiment, the cache 708 may include a mid-level cache (such as a level 2 (L2), a level 3 (L3), a level 4 (L4), or other levels of cache), a last level cache (LLC), and/or combinations thereof. Moreover, various components of the processor 702-1 may communicate with the shared cache 708 directly, through a bus (e.g., the bus 712), and/or a memory controller or hub. As shown in FIG. 7, in some embodiments, one or more of the cores 706 may include a level 1 (L1) cache 716-1 (generally referred to herein as "L1 cache 716"). In one embodiment, the control unit 720 may include logic to implement the operations described above with reference to the memory controller 122 in FIG. 2.

Figure 8:
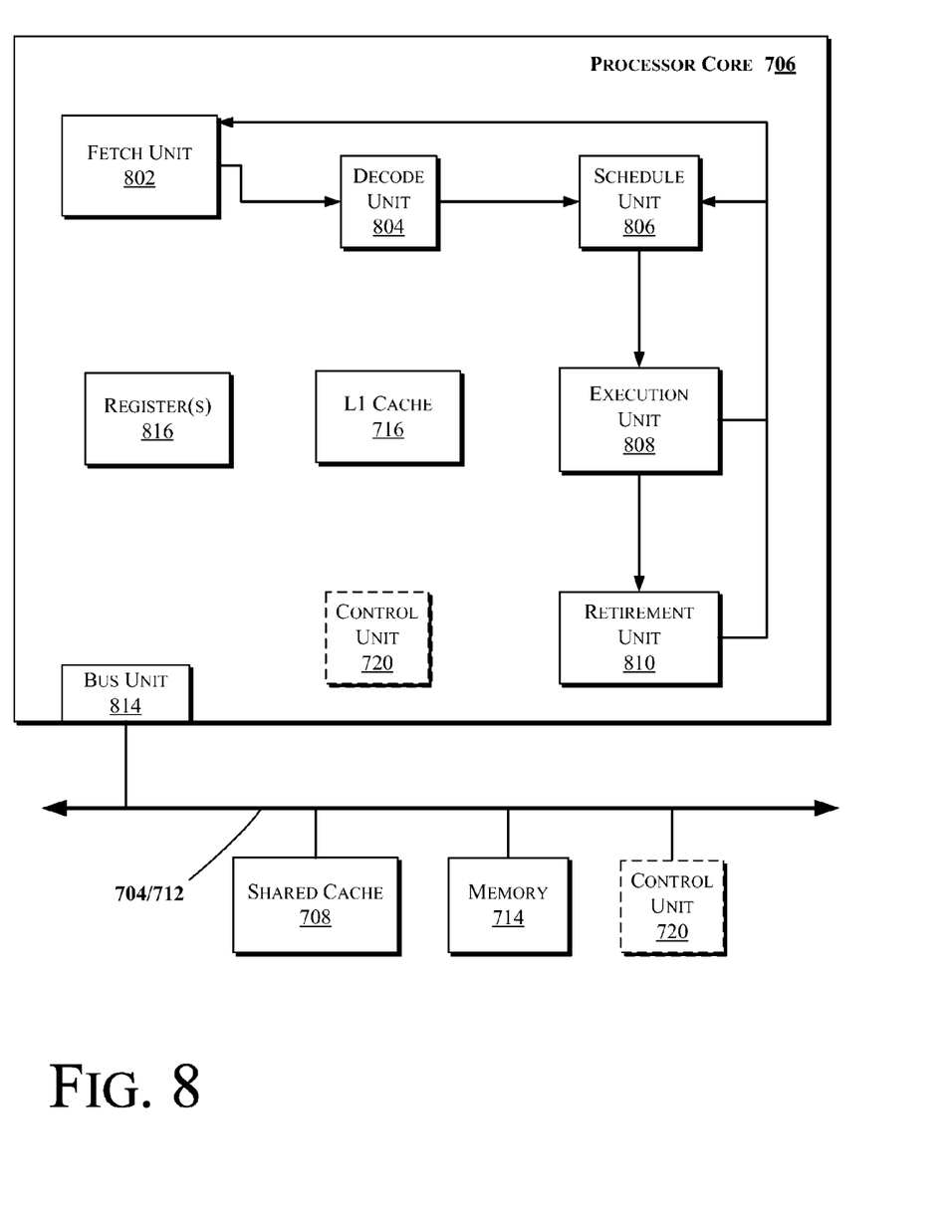

FIG. 8 illustrates a block diagram of portions of a processor core 706 and other components of a computing system, according to an embodiment of the invention. In one embodiment, the arrows shown in FIG. 8 illustrate the flow direction of instructions through the core 706. One or more processor cores (such as the processor core 706) may be implemented on a single integrated circuit chip (or die) such as discussed with reference to FIG. 7. Moreover, the chip may include one or more shared and/or private caches (e.g., cache 708 of FIG. 7), interconnections (e.g., interconnections 704 and/or 112 of FIG. 7), control units, memory controllers, or other components.

As illustrated in FIG. 8, the processor core 706 may include a fetch unit 802 to fetch instructions (including instructions with conditional branches) for execution by the core 706. The instructions may be fetched from any storage devices such as the memory 714. The core 706 may also include a decode unit 804 to decode the fetched instruction. For instance, the decode unit 804 may decode the fetched instruction into a plurality of uops (micro-operations).

Additionally, the core 706 may include a schedule unit 806. The schedule unit 806 may perform various operations associated with storing decoded instructions (e.g., received from the decode unit 804) until the instructions are ready for dispatch, e.g., until all source values of a decoded instruction become available. In one embodiment, the schedule unit 806 may schedule and/or issue (or dispatch) decoded instructions to an execution unit 808 for execution. The execution unit 808 may execute the dispatched instructions after they are decoded (e.g., by the decode unit 804) and dispatched (e.g., by the schedule unit 806). In an embodiment, the execution unit 808 may include more than one execution unit. The execution unit 808 may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit 808.

Further, the execution unit 808 may execute instructions out-of-order. Hence, the processor core 706 may be an out-of-order processor core in one embodiment. The core 706 may also include a retirement unit 810. The retirement unit 810 may retire executed instructions after they are committed. In an embodiment, retirement of the executed instructions may result in processor state being committed from the execution of the instructions, physical registers used by the instructions being de-allocated, etc.

The core 706 may also include a bus unit 714 to enable communication between components of the processor core 706 and other components (such as the components discussed with reference to FIG. 8) via one or more buses (e.g., buses 804 and/or 812). The core 706 may also include one or more registers 816 to store data accessed by various components of the core 706 (such as values related to power consumption state settings).

Furthermore, even though FIG. 7 illustrates the control unit 720 to be coupled to the core 706 via interconnect 812, in various embodiments the control unit 720 may be located elsewhere such as inside the core 706, coupled to the core via bus 704, etc.

Figure 9:
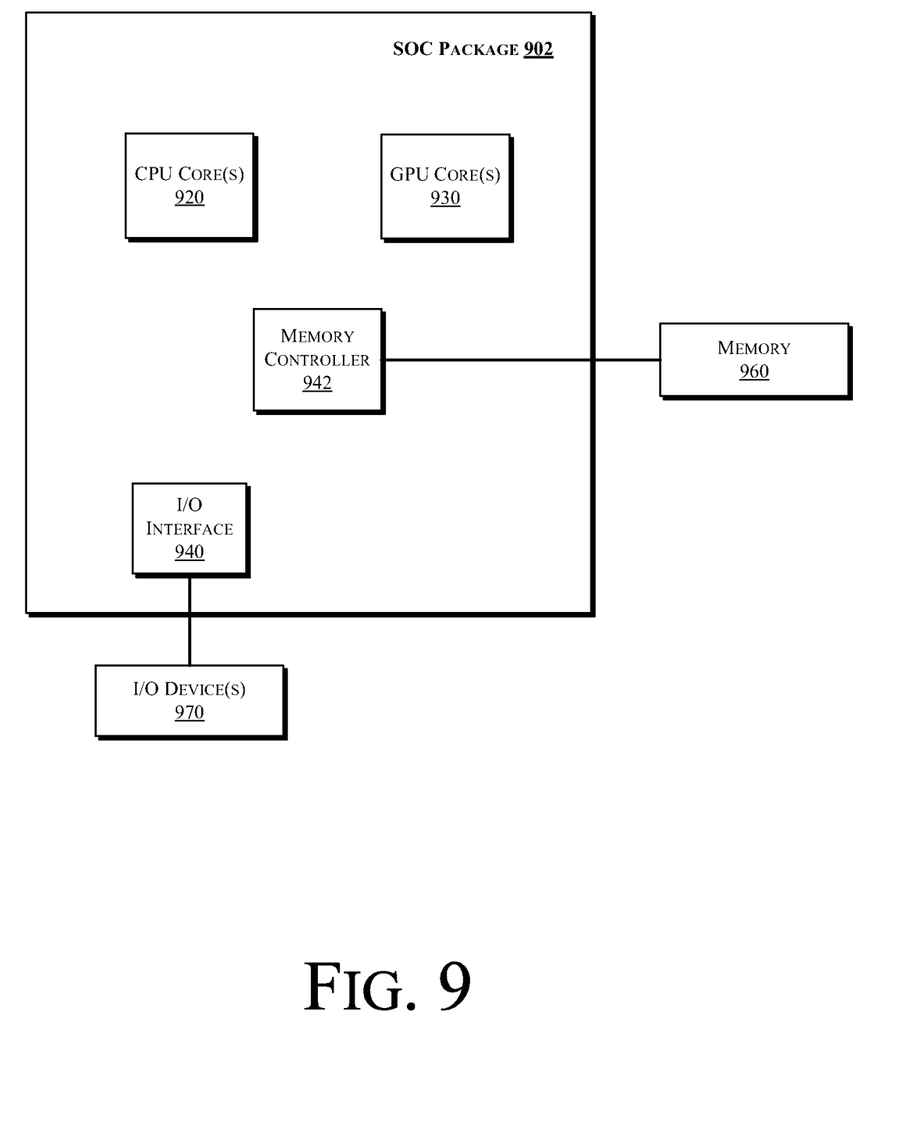

In some embodiments, one or more of the components discussed herein can be embodied as a System On Chip (SOC) device. FIG. 9 illustrates a block diagram of an SOC package in accordance with an embodiment. As illustrated in FIG. 9, SOC 902 includes one or more Central Processing Unit (CPU) cores 920, one or more Graphics Processor Unit (GPU) cores 930, an Input/Output (I/O) interface 940, and a memory controller 942. Various components of the SOC package 902 may be coupled to an interconnect or bus such as discussed herein with reference to the other figures. Also, the SOC package 902 may include more or less components, such as those discussed herein with reference to the other figures. Further, each component of the SOC package 902 may include one or more other components, e.g., as discussed with reference to the other figures herein. In one embodiment, SOC package 902 (and its components) is provided on one or more Integrated Circuit (IC) die, e.g., which are packaged into a single semiconductor device.

As illustrated in FIG. 9, SOC package 902 is coupled to a memory 960 (which may be similar to or the same as memory discussed herein with reference to the other figures) via the memory controller 942. In an embodiment, the memory 960 (or a portion of it) can be integrated on the SOC package 902.

The I/O interface 940 may be coupled to one or more I/O devices 970, e.g., via an interconnect and/or bus such as discussed herein with reference to other figures. I/O device(s) 970 may include one or more of a keyboard, a mouse, a touchpad, a display, an image/video capture device (such as a camera or camcorder/video recorder), a touch screen, a speaker, or the like.

Figure 10:
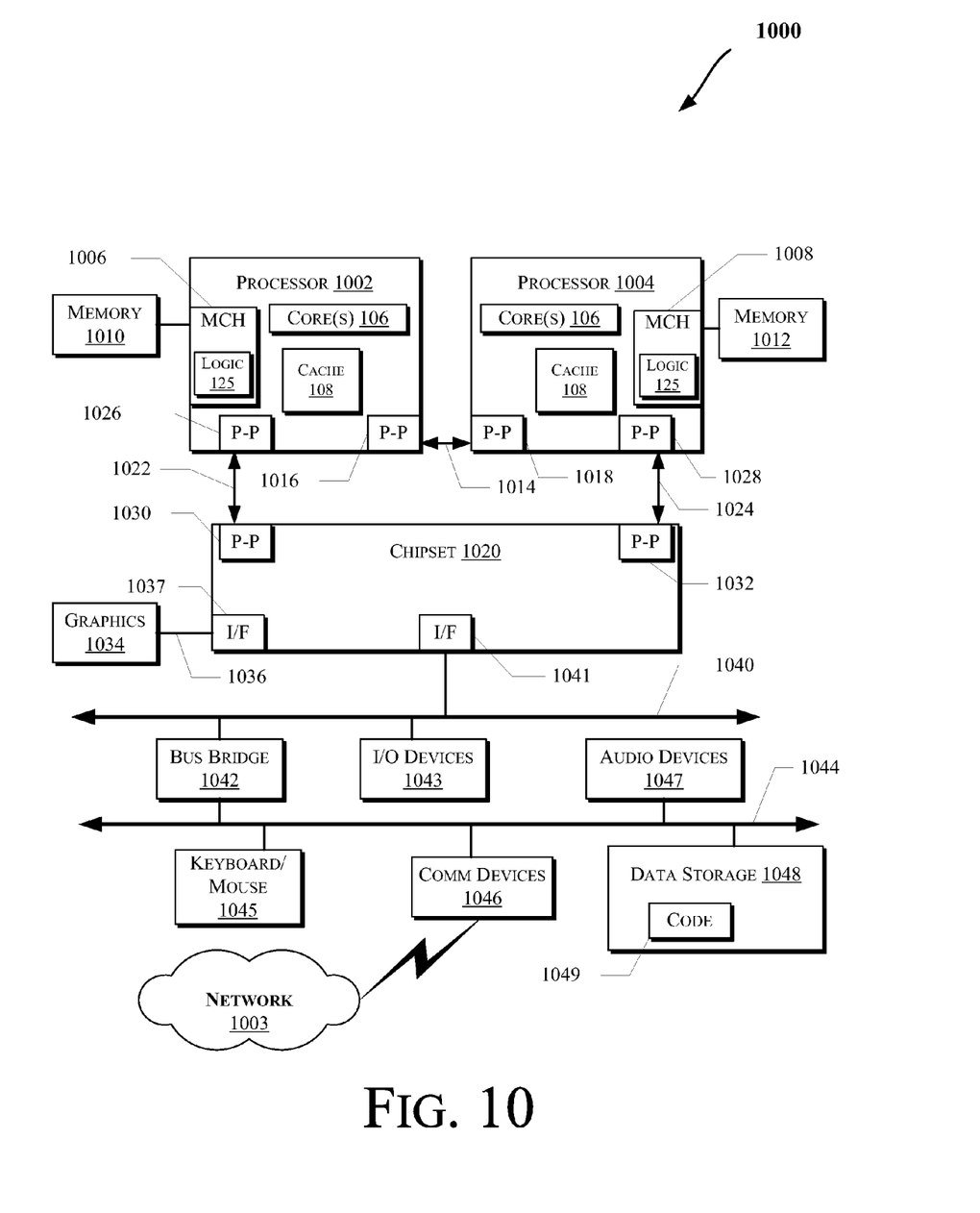

FIG. 10 illustrates a computing system 1000 that is arranged in a point-to-point (PtP) configuration, according to an embodiment of the invention. In particular, FIG. 10 shows a system where processors, memory, and input/output devices are interconnected by a number of point-to-point interfaces. The operations discussed with reference to FIG. 2 may be performed by one or more components of the system 1000.

As illustrated in FIG. 10, the system 1000 may include several processors, of which only two, processors 1002 and 1004 are shown for clarity. The processors 1002 and 1004 may each include a local memory controller hub (MCH) 1006 and 1008 to enable communication with memories 1010 and 1012. MCH 1006 and 1008 may include the memory controller 120 and/or logic 125 of FIG. 1 in some embodiments.

In an embodiment, the processors 1002 and 1004 may be one of the processors 702 discussed with reference to FIG. 7. The processors 1002 and 1004 may exchange data via a point-to-point (PtP) interface 1014 using PtP interface circuits 1016 and 1018, respectively. Also, the processors 1002 and 1004 may each exchange data with a chipset 1020 via individual PtP interfaces 1022 and 1024 using point-to-point interface circuits 1026, 1028, 1030, and 1032. The chipset 1020 may further exchange data with a high-performance graphics circuit 1034 via a high-performance graphics interface 1036, e.g., using a PtP interface circuit 1037.

As shown in FIG. 10, one or more of the cores 106 and/or cache 108 of FIG. 1 may be located within the processors 902 and 904. Other embodiments of the invention, however, may exist in other circuits, logic units, or devices within the system 900 of FIG. 9. Furthermore, other embodiments of the invention may be distributed throughout several circuits, logic units, or devices illustrated in FIG. 9.

The chipset 920 may communicate with a bus 940 using a PtP interface circuit 941. The bus 940 may have one or more devices that communicate with it, such as a bus bridge 942 and I/O devices 943. Via a bus 944, the bus bridge 943 may communicate with other devices such as a keyboard/mouse 945, communication devices 946 (such as modems, network interface devices, or other communication devices that may communicate with the computer network 803), audio I/O device, and/or a data storage device 948. The data storage device 948 (which may be a hard disk drive or a NAND flash based solid state drive) may store code 949 that may be executed by the processors 902 and/or 904.

The following examples pertain to further embodiments.

Example 1 is a memory comprising a memory device, and a controller coupled to the memory device and comprising logic to receive a read request from a host device to read data stored in the memory device, wherein a portion of the data is stored in each of a plurality (N) of dies and a portion of an error correction code (ECC) associated with the data is stored in each of the plurality (N) of dies, in response to the read request, retrieve the data from the memory device, perform an error correction code (ECC) check on the data retrieved from the memory device, and invoke a recovery algorithm in response to an error in the ECC check on the data retrieved from the memory device.

In Example 2, the subject matter of Example 1 can optionally include an arrangement in which the data comprises an ECC codeword, and the ECC check comprises evaluating a result of performing an Exclusive OR (XOR) operation on the data and the ECC code In Example 3, the subject matter of any one of Examples 1-2 can optionally include logic, at least partially including hardware logic, to calculate a second XOR from the data retrieved from the memory device and the result of performing an XOR operation on the data retrieved from the memory device.

In Example 4, the subject matter of any one of Examples 1-3 can optionally include logic, at least partially including hardware logic, to return the data to the host device when the result of performing the second XOR operation is all zeroes.

In Example 5, the subject matter of any one of Examples 1-4 can optionally include logic, at least partially including hardware logic, to return the data to the host device when the contents of the second XOR are all zeroes.

In Example 6, the subject matter of any one of Examples 1-5 can optionally include logic, at least partially including hardware logic, to return the data to the host device when the contents of the second XOR are all zeroes.

In Example 7, the subject matter of any one of Examples 1-6 can optionally include logic, at least partially including hardware logic, to return a read error to the host device when the contents of the second XOR includes a 1.

Example 8 is an electronic device comprising a processor, a memory device, and a controller coupled to the memory device and comprising logic to receive a read request from a host device to read data stored in the memory device, wherein a portion of the data is stored in each of a plurality (N) of dies and a portion of an error correction code (ECC) associated with the data is stored in each of the plurality (N) of dies, in response to the read request, retrieve the data from the memory device, perform an error correction code (ECC) check on the data retrieved from the memory device, and invoke a recovery algorithm in response to an error in the ECC check on the data retrieved from the memory device.

In Example 9, the subject matter of Example 8 can optionally include an arrangement in which the data comprises an ECC codeword, and the ECC check comprises evaluating a result of performing an Exclusive OR (XOR) operation on the data and the ECC code In Example 10, the subject matter of any one of Examples 8-9 can optionally include logic, at least partially including hardware logic, to calculate a second XOR from the data retrieved from the memory device and the result of performing an XOR operation on the data retrieved from the memory device.

In Example 11, the subject matter of any one of Examples 8-10 can optionally include logic, at least partially including hardware logic, to return the data to the host device when the result of performing the second XOR operation is all zeroes.

In Example 12, the subject matter of any one of Examples 8-11 can optionally include logic, at least partially including hardware logic, to return the data to the host device when the contents of the second XOR are all zeroes.

In Example 13, the subject matter of any one of Examples 8-12 can optionally include logic, at least partially including hardware logic, to return the data to the host device when the contents of the second XOR are all zeroes.

In Example 14, the subject matter of any one of Examples 8-13 can optionally include logic, at least partially including hardware logic, to return a read error to the host device when the contents of the second XOR includes a 1.

Example 15 is a computer program product comprising logic instructions stored on a nontransitory computer readable medium which, when executed by a controller coupled to a memory device, configure the controller to receive a read request from a host device to read a line of data to the memory device, wherein the data is spread across a plurality (N) of dies and comprises an error correction code (ECC) spread across the plurality (N) of dies, retrieve the line of data from the memory device, perform an error correction code (ECC) check on the line of data retrieved from the memory device, and invoke a recovery algorithm in response to an error in the ECC check on the line of data retrieved from the memory device In Example 16, the subject matter of Example 15 can optionally include an arrangement in which the data comprises an ECC codeword, and the ECC check comprises evaluating a result of performing an Exclusive OR (XOR) operation on the data and the ECC code In Example 17, the subject matter of any one of Examples 15-16 can optionally include logic instructions stored on a nontransitory computer readable medium which, when executed by a controller coupled to a memory device, configure the controller to calculate a second XOR from the data retrieved from the memory device and the result of performing an XOR operation on the data retrieved from the memory device.

In Example 18, the subject matter of any one of Examples 15-17 can optionally include logic instructions stored on a nontransitory computer readable medium which, when executed by a controller coupled to a memory device, configure the controller to return the data to the host device when the result of performing the second XOR operation is all zeroes.

In Example 19, the subject matter of any one of Examples 15-18 can optionally include logic instructions stored on a nontransitory computer readable medium which, when executed by a controller coupled to a memory device, configure the controller to return the data to the host device when the contents of the second XOR are all zeroes.

In Example 20, the subject matter of any one of Examples 15-19 can optionally include logic instructions stored on a nontransitory computer readable medium which, when executed by a controller coupled to a memory device, configure the controller to return the data to the host device when the contents of the second XOR are all zeroes.

In Example 21, the subject matter of any one of Examples 15-20 can optionally include logic instructions stored on a nontransitory computer readable medium which, when executed by a controller coupled to a memory device, configure the controller to return a read error to the host device when the contents of the second XOR includes a 1.

In various embodiments of the invention, the operations discussed herein, e.g., with reference to FIGS. 1-10, may be implemented as hardware (e.g., circuitry), software, firmware, microcode, or combinations thereof, which may be provided as a computer program product, e.g., including a tangible (e.g., nontransitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed herein.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. A memory, comprising:
a memory device; and
a controller coupled to the memory device and comprising logic, at least partially including hardware logic, configured to:
receive a read request from a host device for read data stored in the memory device, wherein a portion of the read data is stored in each of a plurality of dies and a portion of an error correction code (ECC) codeword associated with the read data is stored in each of the plurality of dies;
in response to the read request, retrieve the read data and the ECC codeword from the plurality of dies;
perform an ECC check on the read data retrieved from the plurality of dies; and
invoke a recovery algorithm in response to an error in the ECC check.

2. The memory of claim 1, wherein:
the ECC check comprises evaluating a result of performing an Exclusive OR (XOR) operation on the read data and the ECC codeword.

3. The memory of claim 2, wherein the logic is further configured— to:
calculate a second XOR from the read data retrieved from the plurality of dies and the result of performing the XOR operation on the read data retrieved from the plurality of dies.

4. The memory of claim 3, wherein the logic is further configured to:
return the read data to the host device when the result of performing the second XOR is all zeroes.

5. The memory of claim 3, wherein the logic is further configured to successively:
locate a position of a 1 in the second XOR; and
implement a loop which traverses the plurality of dies to successively:
flip a bit in a die of the plurality of dies at a position corresponding to the position of the 1 in the second XOR; and
recalculate the second XOR.

6. The memory of claim 5, wherein the logic is further configured to:
return the read data to the host device when the contents of the second XOR are all zeroes.

7. The memory of claim 5, wherein the logic is further configured to:
return a read error to the host device when the contents of the second XOR includes a 1.

8. An electronic device, comprising:
a processor; and
a memory, comprising:
a memory device; and
a controller coupled to the memory device and comprising logic, at least partially including hardware logic, to:
receive a read request from the processor for a line of read data stored in the memory device, wherein the line of read data is spread across a plurality of dies and comprises an error correction code (ECC) codeword spread across the plurality of dies;
retrieve the line of read data and the ECC codeword from the plurality of dies;
perform an ECC check on the line of read data retrieved from the plurality of dies; and
invoke a recovery algorithm in response to an error in the ECC check.

9. The electronic device of claim 8, wherein:
the ECC check comprises evaluating an XOR of the line of read data and the ECC codeword.

10. The electronic device of claim 9, wherein the logic is further configured to:
calculate a second XOR from the line of read data retrieved from the plurality of dies and the XOR of the line of read data retrieved from the plurality of dies.

11. The electronic device of claim 10, wherein the logic is further configured to:
return the line of read data to the processor when the contents of the second XOR are all zeroes.

12. The electronic device of claim 10, wherein the logic is further configured to successively:
locate a position of a 1 in the second XOR; and
implement a loop which traverses the plurality of dies to successively:
flip a bit in a die of the plurality of dies at a position corresponding to the position of the 1 in the second XOR; and
recalculate the second XOR.

13. The electronic device of claim 12, wherein the logic is further configured to:
return the line of read data to the processor when the contents of the second XOR are all zeroes.

14. The electronic device of claim 12, wherein the logic is further configured to:
return a read error to the processor when the contents of the second XOR includes a 1.

15. A computer program product comprising logic instructions stored on a nontransitory computer readable medium which, when executed by a controller coupled to a memory device, configure the controller to:
receive a read request from a host device for a line of read data stored in the memory device, wherein the line of read data is spread across a plurality of dies and comprises an error correction code (ECC) codeword spread across the plurality of dies;
retrieve the line of read data and the ECC codeword from the plurality of dies;
perform an ECC check on the line of read data retrieved from the plurality of dies; and
invoke a recovery algorithm in response to an error in the ECC check.

16. The computer program product of claim 15, wherein:
the ECC check comprises evaluating an XOR of the line of read data and the ECC codeword.

17. The computer program product of claim 16, wherein the logic instructions further configure the controller to:
calculate a second XOR from the line of read data retrieved from the plurality of dies and the XOR of the line of read data retrieved from the plurality of dies.

18. The computer program product of claim 17, wherein the logic instructions further configure the controller to:
return the line of read data to the host device when the contents of the second XOR are all zeroes.

19. The computer program product of claim 17, wherein the logic instructions further configure the controller to successively:
locate a position of a 1 in the second XOR; and
implement a loop which traverses the plurality of dies to successively:
flip a bit in a die of the plurality of dies at a position corresponding to the position of the 1 in the second XOR; and
recalculate the second XOR.

20. The computer program product of claim 19, wherein the logic instructions further configure the controller to:
return the line of read data to the host device when the contents of the second XOR are all zeroes.

21. The computer program product of claim 19, wherein the logic instructions further configure the controller to:
return a read error to the host device when the contents of the second XOR includes a 1.

* * * * *